US012652020B2

(12) United States Patent
Zhou et al.

(10) Patent No.: US 12,652,020 B2
(45) Date of Patent: Jun. 9, 2026

(54) SURFACE ACOUSTIC WAVE RESONATOR DEVICE AND METHOD FOR MANUFACTURING THE SAME, AND SURFACE ACOUSTIC WAVE FILTER

(71) Applicant: Shenzhen Newsonic Technologies Co., Ltd., Shenzhen (CN)

(72) Inventors: Chencheng Zhou, Shenzhen (CN); Guojun Weng, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/982,120

(22) Filed: Dec. 16, 2024

(65) Prior Publication Data

US 2025/0119116 A1 Apr. 10, 2025

Related U.S. Application Data

(63) Continuation of application No. PCT/CN2024/073795, filed on Jan. 24, 2024.

(30) Foreign Application Priority Data

Feb. 13, 2023 (CN) .......................... 202310101495.6

(51) Int. Cl.
H03H 9/25 (2006.01)
H03H 3/10 (2006.01)
(Continued)

(52) U.S. Cl.
CPC ................ H03H 9/25 (2013.01); H03H 3/10 (2013.01); H03H 9/02834 (2013.01); H03H 9/6489 (2013.01)

(58) Field of Classification Search
CPC ............... H03H 9/25; H03H 9/54; H03H 9/64
See application file for complete search history.

(56) References Cited

U.S. PATENT DOCUMENTS 7,569,972 B2 * 8/2009 Nishiyama ......... H03H 9/02559
310/313 R
8,552,622 B2 * 10/2013 Makibuchi .............. H01L 23/10
310/365
(Continued)

FOREIGN PATENT DOCUMENTS

CN 108539006 A 9/2018
CN 115603694 A 1/2023
CN 115913159 A 4/2023

*Primary Examiner* — Andrea Lindgren Baltzell
*Assistant Examiner* — Alan Wong
(74) *Attorney, Agent, or Firm* — LEASON ELLIS LLP

(57) ABSTRACT

A surface acoustic wave resonator device and method for manufacturing the same, and a surface acoustic wave filter, the surface acoustic wave resonator device includes: a first temperature compensation layer and an interdigital electrode structure, disposed on a base substrate, the interdigital electrode structure is at least partially embedded in the first temperature compensation layer, and includes interdigital electrodes extending along a first direction and arranged along a second direction; and a second temperature compensation layer, located on a side of the first temperature compensation layer and the interdigital electrode structure away from the base substrate; the interdigital electrode structure is surrounded and wrapped by the first temperature compensation layer in a direction parallel to the base substrate, and a surface of the interdigital electrode structure at a side away from the base substrate is covered by and in contact with the second temperature compensation layer.

17 Claims, 7 Drawing Sheets

(51) Int. Cl.
    *H03H 9/02*         (2006.01)
    *H03H 9/64*         (2006.01)

(56)              References Cited

U.S. PATENT DOCUMENTS

| | | | | |
|---|---|---|---|---|
| 8,558,356 | B2 * | 10/2013 | Kiwitt | H03H 9/0561 |
| | | | | 257/664 |
| 9,331,667 | B2 * | 5/2016 | Steiner | H10N 30/87 |
| 10,707,833 | B2 * | 7/2020 | Mimura | H03H 9/02834 |
| 2014/0117815 | A1 | 5/2014 | Bi et al. | |

\* cited by examiner

SURFACE ACOUSTIC WAVE RESONATOR DEVICE AND METHOD FOR MANUFACTURING THE SAME, AND SURFACE ACOUSTIC WAVE FILTER

CROSS-REFERENCE TO RELATED APPLICATION(S)

This application is a continuation of International Patent Application No. PCT/CN2024/073795, filed on Jan. 24, 2024, which claims the priority of Chinese Patent Application No. 202310101495.6, filed on Feb. 13, 2023, and the present disclosure of which is hereby incorporated in its entirety as a part of the present application.

TECHNICAL FIELD

Embodiments of the present disclosure relate to the technical field of resonators, and in particular to a surface acoustic wave resonator device, a manufacturing method therefor and a surface acoustic wave filter.

BACKGROUND

In the structure of a temperature compensated surface acoustic wave (TC-SAW) device, an interdigital electrode structure is usually provided. The interdigital electrode structure includes a first bus bar, a second bus bar, a plurality of first interdigital electrodes and a plurality of second interdigital electrodes; each of the first interdigital electrodes is vertically connected to the first bus bar, and each of the second interdigital electrodes is vertically connected to the second bus bar; the first interdigital electrodes and the second interdigital electrodes are arranged in a staggered manner in a direction perpendicular to the first bus bar. How to improve the temperature coefficient of frequency (TCF) of TC-SAW resonator devices and filters is an important research topic for those skilled in this field.

On the other hand, a small metal protrusion is usually stacked on an interdigital electrode end region of the interdigital electrode structure to suppress clutter and ensure excellent filter performance, and the clutter suppression effect will be the best if the metal protrusion is completely vertically aligned with an edge of the interdigital electrode end. Wherein, the metal protrusion is also referred to as a hammer head. In the related art, the metal protrusion is usually additionally formed on the interdigital electrode end region of the interdigital electrode structure by a lift-off process. In this way, because the metal protrusion and the interdigital electrode structure are two independent parts stacked with each other formed by the lift-off process, and line widths of openings during a photolithography process used in the lift-off process may be varied, the metal protrusion may not be completely vertically aligned with the edge of the interdigital electrode end of the interdigital electrode structure, which results in poor clutter suppression effect of surface acoustic wave filters manufactured by such process.

SUMMARY

At least one embodiment of the present disclosure provides a surface acoustic wave resonator device, including: a base substrate; a first temperature compensation layer, disposed on the base substrate; an interdigital electrode structure, disposed on the base substrate and at least partially embedded in the first temperature compensation layer, wherein the interdigital electrode structure includes a plurality of interdigital electrodes extending along a first direction and arranged along a second direction, and the interdigital electrode structure has an interdigital electrode central region, and a first interdigital electrode end region and a second interdigital electrode end region which are located at two opposite sides of the interdigital electrode central region in the first direction; and a second temperature compensation layer, located at a side of the first temperature compensation layer and the interdigital electrode structure away from the base substrate; wherein the interdigital electrode structure is surrounded and wrapped by the first temperature compensation layer in a direction parallel to a main surface of the base substrate, and a surface of the interdigital electrode structure at a side away from the base substrate is covered by and in contact with the second temperature compensation layer.

In the surface acoustic wave resonator device provided by at least one embodiment of the present disclosure, surfaces, at a side away from the base substrate, of portions of the plurality of interdigital electrodes located in the interdigital electrode central region are level with a surface of the first temperature compensation layer at a side away from the base substrate in the direction parallel to the main surface of the base substrate.

In the surface acoustic wave resonator device provided by at least one embodiment of the present disclosure, the interdigital electrode structure includes a seed layer and an electrode material layer, the seed layer surrounds and covers at least a portion of a sidewall of the electrode material layer and a surface of the electrode material layer at a side close to the base substrate, and is located between the electrode material layer and the first temperature compensation layer, and between the electrode material layer and the base substrate.

In the surface acoustic wave resonator device provided by at least one embodiment of the present disclosure, at least a surface of the electrode material layer at a side away from the base substrate is in contact with the second temperature compensation layer.

In the surface acoustic wave resonator device provided by at least one embodiment of the present disclosure, the interdigital electrode structure includes a body structure and a protruding structure, wherein the protruding structure is located in the first interdigital electrode end region and the second interdigital electrode end region, and the protruding structure is protruded from a surface of the body structure at a side away from the base substrate in a direction perpendicular to the main surface of the base substrate.

In the surface acoustic wave resonator device provided by at least one embodiment of the present disclosure, the body structure and the protruding structure are integrally formed and have sidewalls aligned in the direction perpendicular to the main surface of the base substrate.

In the surface acoustic wave resonator device provided by at least one embodiment of the present disclosure, the body structure is embedded in the first temperature compensation layer, and the protruding structure is embedded in the second temperature compensation layer.

In the surface acoustic wave resonator device provided by at least one embodiment of the present disclosure, a sidewall of the body structure is in contact with the first temperature compensation layer; and the surface of the body structure at the side away from the base substrate, a sidewall of the protruding structure, and a surface of the protruding structure at a side away from the base substrate are in contact with the second temperature compensation layer.

At least one embodiment of the present disclosure provides a surface acoustic wave filter, including any one of the above-mentioned surface acoustic wave resonator devices.

At least one embodiment of the present disclosure provides a method for manufacturing a surface acoustic wave resonator device, including: providing a base substrate; forming a first temperature compensation layer on the base substrate; performing a patterning process on the first temperature compensation layer to form a through hole exposing the base substrate; and forming an interdigital electrode structure in the through hole of the first temperature compensation layer; wherein the interdigital electrode structure includes a plurality of interdigital electrodes extending along a first direction and arranged along a second direction, and the interdigital electrode structure has an interdigital electrode central region, and a first interdigital electrode end region and a second interdigital electrode end region which are located at two opposite sides of the interdigital electrode central region in the first direction; and forming a second temperature compensation layer on a side of the first temperature compensation layer and the interdigital electrode structure away from the base substrate.

In the method for manufacturing the surface acoustic wave resonator device provided by at least one embodiment of the present disclosure, forming the interdigital electrode structure in the through hole of the first temperature compensation layer includes: forming an interdigital electrode structure material layer in the through hole; and performing a planarization process on the interdigital electrode structure material layer and the first temperature compensation layer.

In the method for manufacturing the surface acoustic wave resonator device provided by at least one embodiment of the present disclosure, forming the interdigital electrode structure material layer in the through hole includes: forming a seed layer, wherein the seed layer lines a surface of the through hole and covers a surface of the first temperature compensation layer at a side away from the base substrate, and a portion of the seed layer located in the through hole defines a recess; and forming an electrode material layer in the recess, wherein after the planarization process, remaining parts of the seed layer and the electrode material layer constitute the interdigital electrode structure.

In the method for manufacturing the surface acoustic wave resonator device provided by at least one embodiment of the present disclosure, forming the interdigital electrode structure in the through hole includes: depositing a seed layer on the base substrate having been exposed and the first temperature compensation layer having been patterned, wherein a portion of the seed layer located in the through hole defines a recess; filling an electrode metal in the recess; and performing a planarization process on the electrode metal, the first temperature compensation layer and the seed layer, such that surfaces of the first temperature compensation layer, the electrode metal and the seed layer are level with each other, wherein after the planarization process, the portion of the seed layer and the electrode metal located in the through hole constitute the interdigital electrode structure.

In the method for manufacturing the surface acoustic wave resonator device provided by at least one embodiment of the present disclosure, performing the planarization process on the electrode metal, the first temperature compensation layer and the seed layer includes: planarizing the electrode metal, the first temperature compensation layer and the seed layer by using a chemical mechanical polishing process; and etching the electrode metal, the first temperature compensation layer and the seed layer which have been planarized by using an ion beam etching process, so that the electrode metal, the first temperature compensation layer and the seed layer are located at a preset target height.

In the method for manufacturing the surface acoustic wave resonator device provided by at least one embodiment of the present disclosure, before forming the second temperature compensation layer, further including: forming a mask layer on the first interdigital electrode end region and the second interdigital electrode end region of the interdigital electrode structure; and performing an etching process on the interdigital electrode structure by using the mask layer as an etching mask, so as to thin portions of the interdigital electrode structure located in other regions other than the first interdigital electrode end region and the second interdigital electrode end region, so that the first interdigital electrode end region and the second interdigital electrode end region of the interdigital electrode structure are formed with a protruding structure.

In the method for manufacturing the surface acoustic wave resonator device provided by at least one embodiment of the present disclosure, the interdigital electrode structure further includes a first bus bar and a second bus bar; and the method further includes: etching the second temperature compensation layer to form a first opening and a second opening in the second temperature compensation layer to expose the first bus bar and the second bus bar, respectively; and forming a first metal layer on the first bus bar exposed by the first opening, and forming a second metal layer on the second bus bar exposed by the second opening.

In the method for manufacturing the surface acoustic wave resonator device provided by at least one embodiment of the present disclosure, after forming the first metal layer on the first bus bar and forming the second metal layer on the second bus bar, further including: depositing a passivation layer on the first metal layer, the second metal layer and the second temperature compensation layer; and etching the passivation layer to expose the first metal layer and the second metal layer.

BRIEF DESCRIPTION OF DRAWINGS

In order to explain the technical solutions of the embodiments of the present disclosure more clearly, the drawings of the embodiments will be introduced briefly in the following. Obviously, the drawings described below only relate to some embodiments of the present disclosure but do not limit the present disclosure. Elements with the same reference numerals in the drawings are shown as similar elements, and the drawings do not constitute any limitation of scales.

DETAILED DESCRIPTION

Figure 1:
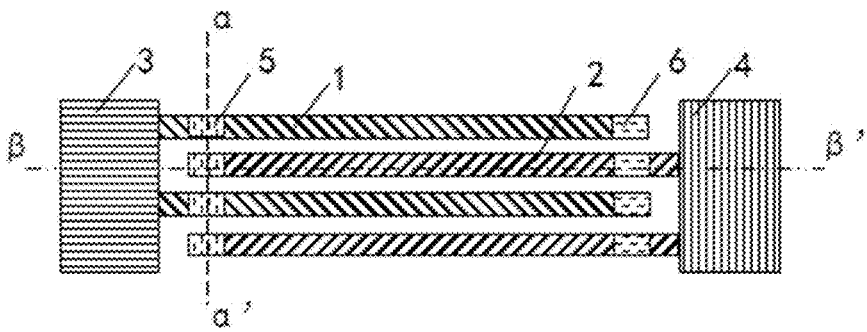
FIG. 1 is a schematic plan view of an interdigital electrode structure and metal protrusions.

In order to understand the characteristics and technical contents of the embodiments of the present disclosure in more details, the implementation of the embodiments of the present disclosure will be described specifically as below in connection with the accompanying drawings, which are for reference and explanation only and are not used to limit the embodiments of the present disclosure. In the following technical description, for the convenience of explanation, numerous details are set forth to provide a thorough understanding of the disclosed embodiments. However, one or more embodiments may still be practiced without these details. In other cases, to simplify the drawings, well-known structures and devices may be presented in a simplified form.

The terms such as "first", "second" and the like in the description and claims of the embodiments of the present disclosure and the above drawings are used to distinguish similar objects, and are not necessarily used to describe a specific order or sequence. It should be understood that the data thus used can be interchanged under appropriate circumstances so as to facilitate describing the embodiments of the present disclosure here. Furthermore, the terms "include", "have" and any variations thereof are intended to cover non-exclusive inclusions.

In the embodiments of the present disclosure, the orientations or positional relationships indicated by the terms "on", "below", "inside", "between", "outside", "in front of" and "behind" are based on the orientations or positional relationships shown in the accompanying drawings. These terms are mainly used to better describe the embodiments of the present disclosure and examples thereof, but are not used to limit that the indicated devices, elements or components must have a specific orientation or be constructed and operated in a specific orientation. Moreover, some of the above terms can be used to indicate not only the orientations or positional relationships, but also other meanings. For example, the term "on" may also be used to indicate a certain dependency or connection relationship in some cases. For those ordinary skilled in the art, the specific meanings of these terms in the embodiments of the present disclosure can be understood according to specific situations.

In addition, the terms "dispose", "connect" and "fix" should be understood broadly. For example, "connection" may be a fixed connection, a detachable connection, or an integral structure; it may be mechanical connection, or electrical connection; it may be direct connection, or indirect connection through an intermedium, or internal connection between two devices, elements or components. For those ordinary skilled in the art, the specific meanings of the above terms in the embodiments of the present disclosure can be understood according to specific situations.

Unless otherwise specified, the term "a plurality of" means two or more.

In the embodiment of the present disclosure, the character "/" indicates that the former object and the latter object are in an "or" relationship. For example, "A/B" stands for: A or B.

The term "and/or" is a description of the relationship between objects, indicating that there may be three kinds of relationships. For example, "A and/or B" stands for the following three relationships: A; or B; or, A and B.

It should be noted that the embodiments of the present disclosure and the features in the embodiments can be combined with each other in case of no conflict.

In some embodiments, FIG. 1 is a schematic plan view of an interdigital electrode structure and metal protrusions. As shown in FIG. 1, the interdigital electrode structure includes: first interdigital electrodes 1, second interdigital electrodes 2, a first bus bar 3 and a second bus bar 4. For example, each of a plurality of first interdigital electrodes 1 is vertically connected to the first bus bar 3, and each of a plurality of second interdigital electrodes 2 is vertically connected to the second bus bar 4. The plurality of first interdigital electrodes 1 and the plurality of second interdigital electrodes 2 extend along a direction perpendicular to the first bus bar 3, and are arranged in a staggered manner in a direction parallel to the bus bars. Metal protrusions are disposed on an interdigital electrode end region of the interdigital electrode structure, and the interdigital electrode end region includes a first interdigital electrode end region and a second interdigital electrode end region. The region of the second interdigital electrodes 2 aligned with ends of the first interdigital electrodes 1 and the region of the ends of the first interdigital electrode 1 are referred to as the first interdigital electrode end region. The metal protrusion provided on the first interdigital electrode end region is referred to as a first protrusion 5. The region of the first interdigital electrodes 1 aligned with ends of the second interdigital electrodes 2 and the region of the ends of the second interdigital electrodes 2 are referred to as the second interdigital electrode end region. The metal protrusion provided on the second interdigital electrode end region is referred to as a second protrusion 6.

Figure 2:
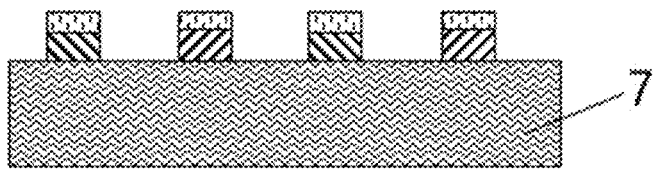
FIG. 2 is a cross-sectional view of a first type of surface acoustic wave resonator along a cross-section line $\alpha$-$\alpha'$ shown in FIG. 1.
Figure 3:
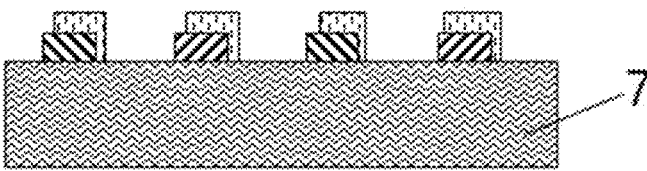
FIG. 3 is a cross-sectional view of a second type of surface acoustic wave resonator along a cross-section line $\alpha$-$\alpha'$ shown in FIG. 1.
Figure 4:
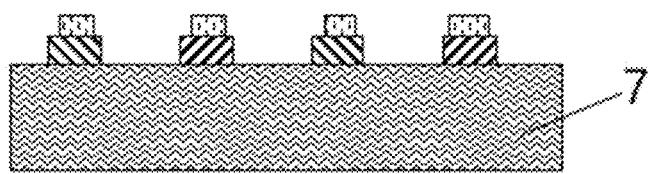
FIG. 4 is a cross-sectional view of a third type of surface acoustic wave resonator along a cross-section line $\alpha$-$\alpha'$ shown in FIG. 1.
Figure 5:
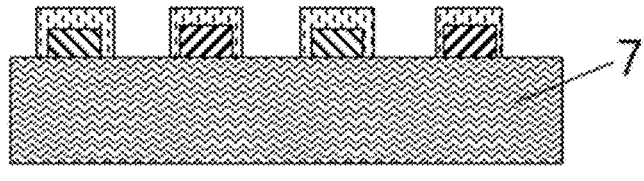
FIG. 5 is a cross-sectional view of a fourth type of surface acoustic wave resonator provided by an embodiment of the present disclosure along a cross-section line $\alpha$-$\alpha'$ shown in FIG. 1.
Figure 6:
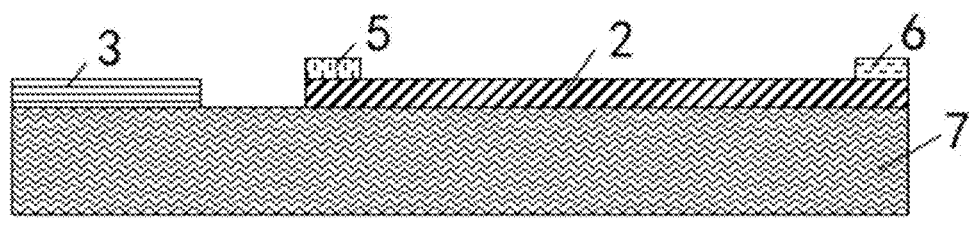
FIG. 6 is a cross-sectional view of a first type of surface acoustic wave resonator along a cross-section line $\beta$-$\beta'$ shown in FIG. 1.
Figure 7:
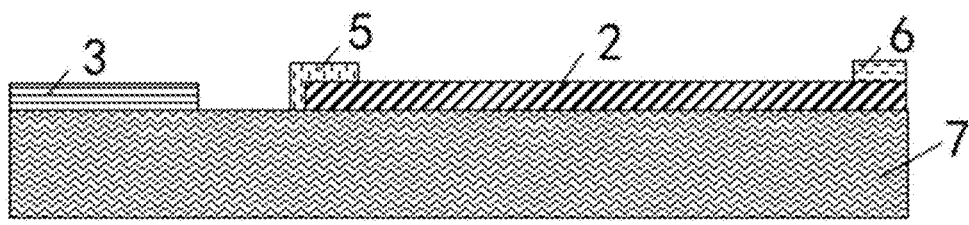
FIG. 7 is a cross-sectional view of a second type of surface acoustic wave resonator along a cross-section line β-β' shown in FIG. 1.

In some embodiments, regarding the arrangement of the metal protrusion, when the metal protrusion is vertically aligned with an edge of the end of the first interdigital electrode or an edge of the end of the second interdigital electrode, the surface acoustic wave filter can achieve the best effect of clutter suppression. FIG. 2 is a cross-sectional view of a first type of surface acoustic wave filter along the cross-section line α-α' shown in FIG. 1. As shown in FIG. 2, in an ideal state, the first interdigital electrodes and the second interdigital electrodes are disposed on a base substrate 7, and metal protrusions are disposed on the first interdigital electrodes and the second interdigital electrodes. The metal protrusion is vertically aligned with the edge of the end of the first interdigital electrode or the edge of the end of the second interdigital electrode. However, in the actual manufacturing process, due to the manufacturing process, the situation where the metal protrusion cannot be vertically aligned with the edge of the end of the first interdigital electrode 1 or the edge of the end of the second interdigital electrode 2 is prone to occur, resulting in structures shown in FIG. 3 to FIG. 5. Wherein, FIG. 3 is a cross-sectional view of a second type of surface acoustic wave resonator along the cross-section line α-α' shown in FIG. 1. As shown in FIG. 3, the first interdigital electrodes and the second interdigital electrodes are disposed on the base substrate 7, and metal protrusions are disposed on the first interdigital electrodes and the second interdigital electrodes. The metal protrusion is offset towards a side of the first interdigital electrode or the metal protrusion is offset towards a side of the second interdigital electrode. FIG. 4 is a cross-sectional view of a third type of surface acoustic wave resonator along the cross-section line α-α' shown in FIG. 1. As shown in FIG. 4, the first interdigital electrodes and the second interdigital electrodes are disposed on the base substrate 7, and metal protrusions are disposed on the first interdigital electrodes and the second interdigital electrodes. The metal protrusion fails to just completely cover the edge of the end of the first interdigital electrode or the edge of the end of the second interdigital electrode. FIG. 5 is a cross-sectional view of a fourth type of surface acoustic wave resonator along the cross-section line α-α' shown in FIG. 1. As shown in FIG. 5, the first interdigital electrodes and the second interdigital electrodes are disposed on the base substrate 7, and metal protrusions are disposed on the first interdigital electrodes and the second interdigital electrodes. The metal protrusion is excessively large and exceeds the range of the edge of the end of the first interdigital electrode or the edge of the end of the second interdigital electrode. FIG. 6 is a cross-sectional view of a first type of surface acoustic wave resonator along the cross-section line β-β' shown in FIG. 1. As shown in FIG. 6, in an ideal state, the second interdigital electrodes 2 and the first bus bar 3 are disposed on the base substrate 7, and the first protrusion 5 and the second protrusion 6 are disposed on the second interdigital electrode 2. The first protrusion 5 is completely vertically aligned with the edge of the end of the second interdigital electrode 2. FIG. 7 is a cross-sectional view of a second type of surface acoustic wave resonator along the cross-section line β-β' shown in FIG. 1. As shown in FIG. 7, the second interdigital electrode 2 and the first bus bar 3 are disposed on the base substrate 7, and the first protrusion 5 and the second protrusion 6 are disposed on the second interdigital electrode 2, and the first protrusion 5 fails to be vertically aligned with the edge of the end of the second interdigital electrode 2.

Figure 8:
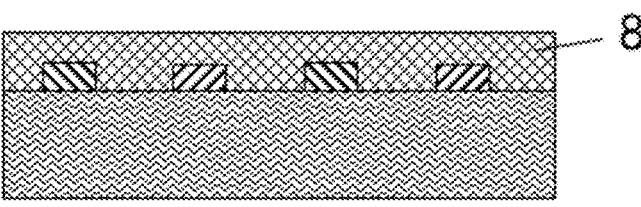
FIG. 8 is a schematic structural view of a first interdigital electrode, a second interdigital electrode and a first temperature compensation layer provided by an embodiment of the present disclosure in an ideal state.
Figure 9:
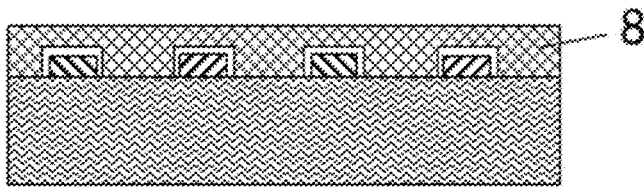
FIG. 9 is a schematic structural view of a first interdigital electrode, a second interdigital electrode and a first temperature compensation layer in an existing structure.

In some embodiments, regarding the arrangement of the first interdigital electrodes and the second interdigital electrodes of the interdigital electrode structure as well as the first temperature compensation layer, because the first temperature compensation layer is configured to compensate for a frequency shift caused by temperature, the better the temperature compensation layer wraps the first interdigital electrode or the second interdigital electrode, the better the temperature coefficient of frequency (TCF) performance of the surface acoustic wave resonator and the filter. Therefore, the TCF performance of the surface acoustic wave filter will be the best if the first temperature compensation layer tightly wraps the first interdigital electrode or the second interdigital electrode. FIG. 8 is a schematic structural view of the first interdigital electrode, the second interdigital electrode and the first temperature compensation layer in an ideal state. As shown in FIG. 8, both the first interdigital electrodes and the second interdigital electrodes are tightly wrapped by the first temperature compensation layer 8. However, in the prior art, due to the manufacturing process, it is easy to cause the situation shown in FIG. 9, which is a schematic structural view of the first interdigital electrodes, the second interdigital electrodes and the first temperature compensation layer in the prior art. As shown in FIG. 9, neither the first interdigital electrode nor the second interdigital electrode is tightly wrapped by the first temperature compensation layer 8, and there is a gap between the first interdigital electrode and the first temperature compensation layer 8, and there is also a gap between the second interdigital electrode and the first temperature compensation layer 8.

In view of the above problems, embodiments of the present disclosure provide a surface acoustic wave resonator device, a manufacturing method therefor and a surface acoustic wave filter, which enable the temperature compensation layer to tightly wrap the interdigital electrode structure, so as to improve the adhesion between the temperature compensation layer and the interdigital electrode structure, and to avoid the occurrence of gaps between the temperature compensation layer and the interdigital electrode structure, thereby improving the TCF performance of the surface acoustic wave resonator device.

For example, a surface acoustic wave resonator device includes: a base substrate; a first temperature compensation layer, disposed on the base substrate; an interdigital electrode structure, disposed on the base substrate and at least partially embedded in the first temperature compensation layer, wherein the interdigital electrode structure includes a plurality of interdigital electrodes extending along a first direction and arranged along a second direction, and the interdigital electrode structure has an interdigital electrode central region, and a first interdigital electrode end region and a second interdigital electrode end region which are located at two opposite sides of the interdigital electrode central region in the first direction; and a second temperature compensation layer, located on a side of the first temperature compensation layer and the interdigital electrode structure away from the base substrate; wherein the interdigital electrode structure is surrounded and wrapped by the first temperature compensation layer in a direction parallel to a main surface of the base substrate, and a surface of the interdigital electrode structure at a side away from the base substrate is covered by and in contact with the second temperature compensation layer.

For example, a manufacturing method for a surface acoustic wave resonator device includes: providing a base substrate; forming a first temperature compensation layer on the base substrate; performing a patterning process on the first temperature compensation layer to form a through hole exposing the base substrate; and forming an interdigital electrode structure in the through hole of the first temperature compensation layer, wherein the interdigital electrode structure includes a plurality of interdigital electrodes extending along a first direction and arranged along a second direction, and the interdigital electrode structure has an interdigital electrode central region, and a first interdigital electrode end region and a second interdigital electrode end region which are located at two opposite sides of the interdigital electrode central region in the first direction; and forming a second temperature compensation layer on a side of the first temperature compensation layer and the interdigital electrode structure away from the base substrate.

In some embodiments, forming the interdigital electrode structure in the through hole of the first temperature compensation layer includes: forming an interdigital electrode structure material layer on the first temperature compensation layer and in the through hole; and performing a planarization process on the interdigital electrode structure material layer and the first temperature compensation layer.

In some embodiments, forming the interdigital electrode structure material layer in the through hole includes: forming a seed layer to line a surface of the through hole and cover a surface of the first temperature compensation layer at a side away from the base substrate, and a portion of the seed layer located in the through hole defines a recess; and forming an electrode material layer in the recess. After the planarization process is performed, remaining portions of the seed layer and the electrode material layer constitute the interdigital electrode structure.

In some embodiments, before forming the second temperature compensation layer, the manufacturing method further includes: forming a mask layer on the first interdigital electrode end region and the second interdigital electrode end region of the interdigital electrode structure; and performing an etching process on the interdigital electrode structure by using the mask layer as an etching mask, so that portions of the interdigital electrode structure located in other regions other than the first interdigital electrode end region and the second interdigital electrode end region are thinned, so that the first interdigital electrode end region and the second interdigital electrode end region of the interdigital electrode structure are formed with a protruding structure.

The surface acoustic wave resonator device, the manufacturing method therefor and the surface acoustic wave filter provided by the embodiments of the present disclosure can achieve the following technical effects: through forming the first temperature compensation layer on the base substrate and forming the interdigital electrode structure embedded in the first temperature compensation layer, and then forming the second temperature compensation layer on the first temperature compensation layer and the interdigital electrode structure, the temperature compensation layer can wrap the interdigital electrode structure in a better way, thereby improving the TCF performance of the surface acoustic wave resonator device and the filter. On the other hand, through etching the interdigital electrode structure, the interdigital electrode end regions of the interdigital electrode structure are formed with protruding structures, the protruding structures can be used as a clutter suppression structure, which is integrally formed with a body structure of the interdigital electrode structure and has the same material with the body structure, so that the protruding structure is self-aligned with the edge of the end of the first interdigital electrode and the edge of the end of the second interdigital electrode of the interdigital electrode structure, thereby improving the clutter suppression effect of the surface acoustic wave resonator device and the filter.

Figure 10:
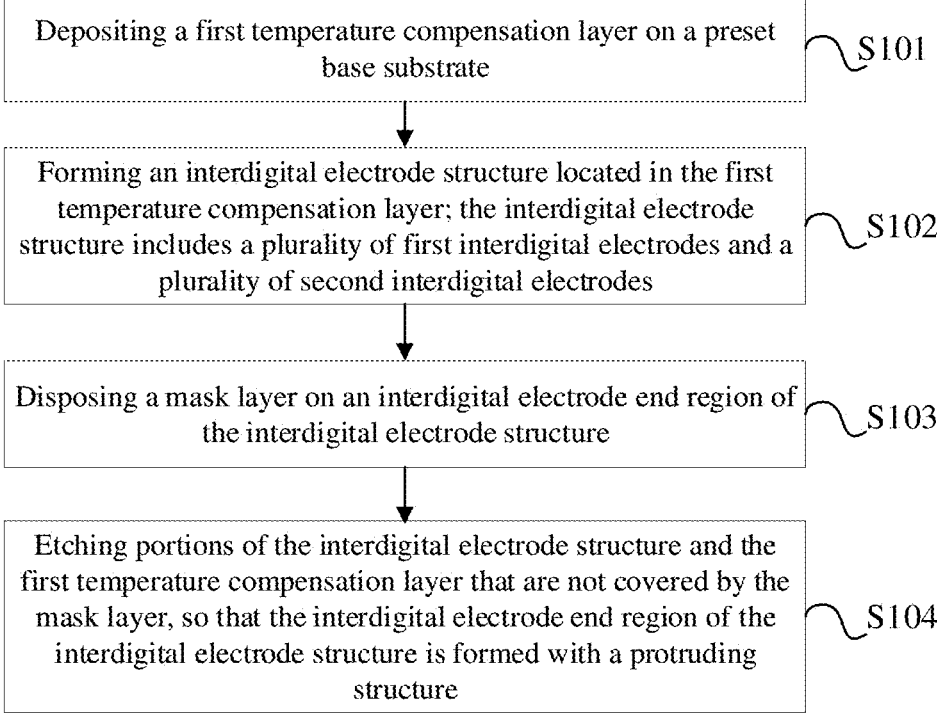
FIG. 10 is a schematic view of a method for manufacturing a surface acoustic wave resonator device provided by an embodiment of the present disclosure.

Referring to FIG. 10, an embodiment of the present disclosure provides a method for manufacturing a surface acoustic wave resonator device, which includes the following steps.

Step S101, depositing a first temperature compensation layer on a preset base substrate.

S102, forming an interdigital electrode structure located in the first temperature compensation layer; the interdigital electrode structure includes a plurality of first interdigital electrodes and a plurality of second interdigital electrodes.

Step S103, disposing a mask layer (e.g., photoresist) on interdigital electrode end regions of the interdigital electrode structure; the interdigital electrode end region includes the region of the second interdigital electrodes aligned with ends of the first interdigital electrodes, the region of the first interdigital electrodes aligned with ends of the second interdigital electrodes, the region of the ends of the first interdigital electrodes, and the region of the ends of the second interdigital electrodes.

Step S104: etching portions of the interdigital electrode structure and the first temperature compensation layer that are not covered by the mask layer, so that the interdigital electrode end regions of the interdigital electrode structure are formed with a protruding structure (for example, metal protrusions).

Through adopting the manufacturing method for the surface acoustic wave resonator device and the filter provided by the embodiments of the present disclosure, a first temperature compensation layer is deposited on a preset base substrate, and then an interdigital electrode structure located in the first temperature compensation layer is formed. By depositing the first temperature compensation layer firstly and then forming the interdigital electrode structure in the first temperature compensation layer, the first temperature compensation layer can wrap the interdigital electrode structure in a better way, thereby improving the temperature coefficient of frequency of the surface acoustic wave resonator and the filter. The interdigital electrode structure includes a plurality of first interdigital electrodes and a plurality of second interdigital electrodes. The plurality of first interdigital electrodes and the plurality of second interdigital electrodes extend substantially parallel to each other along a first direction and are alternately arranged in a second direction. In the manufacturing method, a mask layer is disposed at the interdigital electrode end region of the interdigital electrode structure. The interdigital electrode end region includes the region of the second interdigital electrodes aligned with the ends of the first interdigital electrodes in the second direction, the region of the first interdigital electrodes aligned with the ends of the second interdigital electrodes in the second direction, the region of the ends of the first interdigital electrodes, and the region of the ends of the second interdigital electrodes. Portions of the interdigital electrode structure and the first temperature compensation layer that are not covered by the mask layer are etched, so that the interdigital electrode end region of the interdigital electrode structure is formed with metal protrusions. In this way, by etching the interdigital electrode structure, the metal protrusions and the interdigital electrode structure are integrally formed and include the same material, so that the metal protrusions are self-aligned with the edge of the end of the first interdigital electrode and the edge of the end of the second interdigital electrode of the interdigital electrode structure, i.e., they can be directly vertically aligned with each other, thereby improving the clutter suppression performance of the surface acoustic wave resonator device and the filter.

In some embodiments, the base substrate is formed of a piezoelectric material such as lithium niobate, lithium tantalate, the like.

In some embodiments, the first temperature compensation layer is formed of silicon oxide (e.g., $SiO_2$), for example, the first temperature compensation layer may be a single-layered structure including silicon oxide.

Optionally, forming the interdigital electrode structure located in the first temperature compensation layer includes: etching the first temperature compensation layer to form a through hole exposing the base substrate; and filling an interdigital electrode structure material (e.g., metal) in the through hole to form the interdigital electrode structure.

Optionally, filling the interdigital electrode structure material (e.g., metal) in the through hole to form the interdigital electrode structure includes: depositing a seed layer on the base substrate being exposed and the first temperature compensation layer being etched, wherein a portion of the seed layer located in the through hole extends along a surface of the base substrate and sidewalls of the first temperature compensation layer and defines a recess; forming an electrode material layer (e.g., metal) in the recess; performing a planarization process on the electrode material layer, the seed layer and the first temperature compensation layer, so that the first temperature compensation layer, the electrode material layer (e.g., metal) and the seed layer are all at a preset height and have surfaces level with each other, for example, level in a direction parallel to the main surface of the base substrate. After the planarization process is performed on the electrode material layer (e.g., electrode metal), the seed layer and the first temperature compensation layer, the interdigital electrode structure materials (i.e., the electrode material layer and the seed layer) in the through hole collectively constitute the interdigital electrode structure. In this way, by etching the first temperature compensation layer to form a through hole for forming the interdigital electrode structure and by filling an interdigital electrode structure material in the through hole, the first temperature compensation layer can tightly surround and wrap the interdigital electrode structure, and hence the TCF of the surface acoustic wave resonator device and the filter including the same can be improved.

In some embodiments, the seed layer may be a metal seed layer, and may include titanium (Ti) and/or chromium (Cr), for example.

In some embodiments, the electrode material layer may include a metal material, such as one selected from titanium (Ti), chromium (Cr), silver (Ag), copper (Cu), molybdenum (Mo), platinum (Pt), tungsten (W) and aluminum (Al) or may be a combined stack layer of two or more selected from the above materials.

In some embodiments, filling the electrode material layer in the recess includes: forming the electrode material layer in the recess through an evaporation process. Alternatively, the electrode material layer may be formed in the recess through an electroplating process. For example, in the electroplating process, appropriate electroplating solution and electroplating process equipment can be used, so that electroplating occurs firstly in the recess; that is, the electrode material layer is formed in the recess firstly, and then begins to be formed on the seed layer at a side of the first temperature compensation layer away from the base substrate after the electrode material fills up the recess. In some embodiments, the electroplating process can be controlled so that the electrode material layer can be accurately filled only in the recess and will not be formed on the seed layer at a side of the first temperature compensation layer away from the base substrate. For example, in some embodiments, in a direction perpendicular to the main surface of the base substrate, a thickness of the electrode material layer formed in the recess may be less than or equal to a depth of the recess. In this way, in the subsequent planarization process, the material that needs to be removed can be reduced, thereby reducing the manufacturing cost of the surface acoustic wave resonator and the filter.

Optionally, performing a planarization process on the electrode material layer, the first temperature compensation layer and the seed layer may at least include: planarizing the electrode material layer, the first temperature compensation layer and the seed layer by using a chemical mechanical polishing process. A thickness of the electrode material layer after planarization may be slightly greater than a target thickness, and in some embodiments, the planarization process may further include: precisely trimming the electrode material layer, the first temperature compensation layer and the seed layer after being planarized by using a trimming process such as ion beam etching, so that the electrode material layer, the first temperature compensation layer and the seed layer have a preset target height. The preset target height is a sum of a thickness of the body structure and a thickness of the metal protrusion in an interdigital electrode structure which can be operated normally. For example, the interdigital electrode structure includes a plurality of first interdigital electrodes, a plurality of second interdigital electrodes, a first bus bar and a second bus bar.

For example, after etching portions of the interdigital electrode structure and the first temperature compensation layer that are not covered by the mask layer, the manufacturing method further includes: removing the mask layer, for example, the mask layer includes a photoresist, and removing the mask layer includes lifting off the photoresist; depositing a second temperature compensation layer on the first temperature compensation layer and the interdigital electrode structure which have been etched; etching the second temperature compensation layer to form a first opening and a second opening to expose the first bus bar and the second bus bar, respectively; and forming a first metal layer on the first bus bar exposed by the first opening, and forming a second metal layer on the second bus bar exposed by the second opening.

For example, the second temperature compensation layer is formed of a single layer of silicon dioxide ($SiO_2$). Alternatively, the second temperature compensation layer is formed of a thin layer of a material such as silicon nitride (SiN), aluminum nitride (AlN), amorphous silicon, gallium nitride (GaN) or the like, stacked with a thick layer of silicon dioxide ($SiO_2$). Among them, the thin layer of a material such as silicon nitride (SiN), aluminum nitride (AlN), amorphous silicon, gallium nitride (GaN) or the like is used as a protective layer which is in contact with the interdigital electrode structure, thereby preventing the electrode material layer (e.g., metal) of the interdigital electrode structure from being oxidized when depositing $SiO_2$ as a main part of the temperature compensation layer.

Optionally, after forming the first metal layer on the first bus bar and forming the second metal layer on the second bus bar, the manufacturing method further includes: depositing a passivation layer on the first metal layer, the second metal layer and the second temperature compensation layer; and etching the passivation layer to expose the first metal layer and the second metal layer.

For example, the first metal layer includes one of titanium (Ti), chromium (Cr), aluminum (Al), copper (Cu), nickel (Ni), silver (Ag), and gold (Au) or includes a combined stack layer formed of a plurality of materials among the above-mentioned materials.

For example, the second metal layer includes one of titanium (Ti), chromium (Cr), aluminum (Al), copper (Cu), nickel (Ni), silver (Ag), and gold (Au) or includes a combined stack layer formed of a plurality of materials among the above-mentioned materials.

For example, the passivation layer includes one of insulating materials such as silicon nitride (SiN), aluminum nitride (AlN), amorphous silicon and gallium nitride (GaN), and the like, or a combined stack layer formed of a plurality of materials among the above-mentioned materials.

Figure 11:
FIG. 11 is a schematic plan view of a surface acoustic wave resonator device according to an embodiment of the present disclosure.
Figure 11:
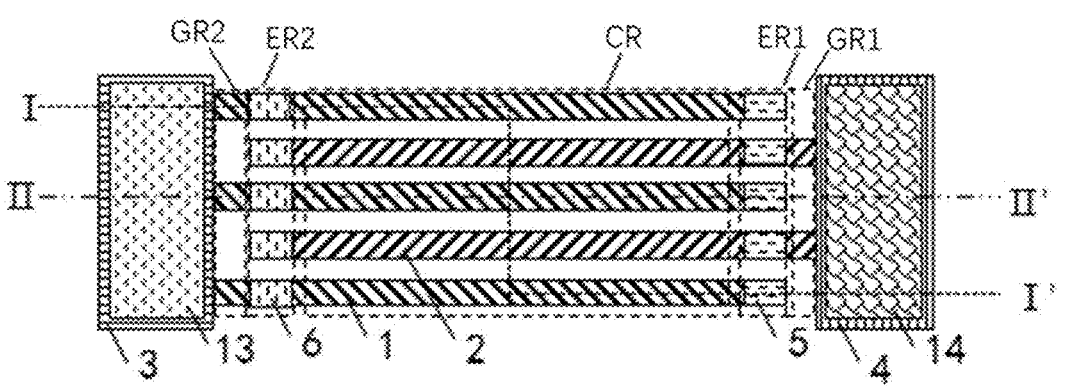
Figure 24:
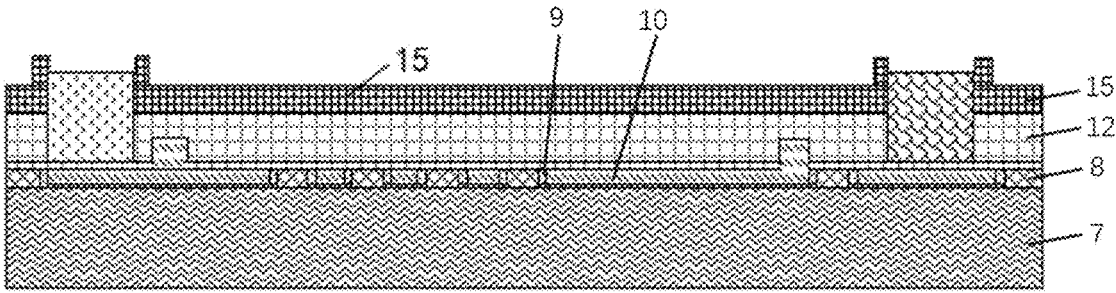
FIG. 24 is a schematic view illustrating a structure after etching a passivation layer, as provided by an embodiment of the present disclosure.
Figure 25:
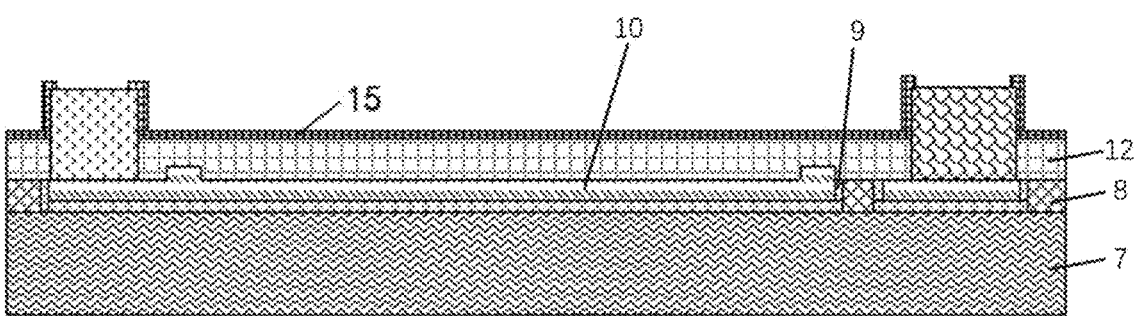
FIG. 25 is a cross-sectional view of a surface acoustic wave resonator device as provided by an embodiment of the present disclosure taken along a line II-II' shown in FIG. 11.

In some embodiments, FIG. 11 is a schematic plan view of a surface acoustic wave resonator device according to some embodiments of the present disclosure. FIG. 24 and FIG. 25 illustrate schematic cross-sectional views of a surface acoustic wave resonator device according to some embodiments of the present disclosure, taken along lines I-I' and II-II' of FIG. 11, respectively.

Referring to FIG. 11, FIG. 24 and FIG. 25, in some embodiments, the surface acoustic wave resonator device includes an interdigital electrode structure, a first temperature compensation layer 8, a second temperature compensation layer 12, a first metal layer 13, a second metal layer 14 and a passivation layer 15. The interdigital electrode structure includes a plurality of interdigital electrodes extending along a first direction D1 and arranged along a second direction D2, a first bus bar 3 and a second bus bar 4. The plurality of interdigital electrodes may include first interdigital electrodes 1 and second interdigital electrodes 2. For example, a plurality of first interdigital electrodes 1 and a plurality of second interdigital electrodes 2 extend substantially parallel to each other along the first direction D1 and are alternately arranged at intervals along the second direction D2; each of the first interdigital electrodes 1 has one end connected to the first bus bar 3, and another end facing and spaced apart from the second bus bar 4; each of the second interdigital electrodes 2 has one end connected to the second bus bar 4, and another end facing and spaced apart from the first bus bar 3. For example, the first bus bar 3 and the second bus bar 4 extend substantially parallel to each other in the second direction D2; the plurality of first interdigital electrodes 1 are connected with each other through the first bus bar 3; and the plurality of second interdigital electrodes 2 are connected with each other through the second bus bar 4. That is, each of the first interdigital electrodes 1 is vertically connected to the first bus bar 3, and each of the second interdigital electrodes 2 is vertically connected to the second bus bar 4; and the first interdigital electrodes 1 and the second interdigital electrodes 2 are arranged in a staggered manner in a direction parallel to the bus bars.

In some embodiments, the interdigital electrode structure has an interdigital electrode central region CR, a first interdigital electrode end region ER1, a second interdigital electrode end region ER2, a first gap region GR1 and a second gap region GR2. The first interdigital electrode end region ER1 and the second interdigital electrode end region ER2 are located at two opposite sides of the interdigital electrode central region CR in the first direction D1. The first gap region GR1 is located at a side of the first interdigital electrode end region ER1 away from the interdigital electrode central region CR, and is located between the first interdigital electrode end region ER1 and the second bus bar 4. The second gap region GR2 is located at a side of the second interdigital electrode end region ER2 away from the interdigital electrode central region CR, and is located between the second interdigital electrode end region ER2 and the first bus bar 3.

Each interdigital electrode includes a central part, a first end, a second end and a spacing part which are connected with each other; the first end and the second end are located at two opposite sides of the central part in the first direction D1; the spacing part is located at a side of the second end away from the central part and is connected to the corresponding bus bar; the first end and the second end collectively constitute an end portion of the interdigital electrode. The respective parts of each interdigital electrode are connected with each other and are continuous, and are integrally formed; that is, there is no interface between the respective parts of each interdigital electrode. In some embodiments, the interdigital electrode and the bus bar that are connected with each other may also be integrally formed.

In each interdigital electrode of the first interdigital electrodes 1 and the second interdigital electrodes 2, the central part is located in the interdigital electrode central region CR, the first end is located in one of the first and second interdigital electrode end regions ER1 and ER2, the second end is located in the other one of the first and second interdigital electrode end regions ER1 and ER2, and the spacing part is located in one of the first and second gap regions GR1 and GR2. For example, in the first interdigital electrode 1, the central part, the first end, the second end and the spacing part are located in the interdigital electrode central region CR, the first interdigital electrode end region ER1, the second interdigital electrode end region ER2 and the second gap region GR2, respectively; in the second interdigital electrode 2, the central part, the first end, the second end and the spacing part are located in the interdigital electrode central region CR, the second interdigital electrode end region ER2, the first interdigital electrode end region ER1 and the first gap region GR1, respectively.

In the interdigital electrode central region CR, central parts of a plurality of first interdigital electrodes 1 and second interdigital electrodes 2 are overlapped (for example, completely overlapped) in the second direction D2. In the first interdigital electrode end region ER1, the second end of the second interdigital electrode 2 and the first end of the first interdigital electrode 1 are overlapped and substantially aligned with each other in the second direction. In the second interdigital electrode end region ER2, the second end of the first interdigital electrode 1 and the first end of the second interdigital electrode 2 are overlapped and substantially aligned with each other in the second direction. The spacing part of the second interdigital electrode 2 is located in the first gap region GR1, and connects the second end of the second interdigital electrode 2 to the second bus bar 4; and the first interdigital electrode 1 is not disposed in the first gap region GR1. The spacing part of the first interdigital electrode 1 is located in the second gap region GR2, and connects the second end of the first interdigital electrode 1 to the first bus bar 3; and the second interdigital electrode 2 is not disposed in the second gap region GR2.

In some embodiments, the interdigital electrode structure includes a body structure and a protruding structure, wherein the protruding structure is disposed in the first interdigital electrode end region ER1 and the second interdigital electrode end region ER2, and is protruded from a surface of the body structure at a side away from the base substrate in a direction perpendicular to the main surface of the base substrate; the body structure and the protruding structure are integrally formed, and have sidewalls or edges aligned in the direction perpendicular to the main surface of the base substrate. For example, each end of the end portion of each interdigital electrode includes an end body and an end protrusion, the end protrusion is located on a side of the end body away from the base substrate and is protruded from a surface of other parts of the interdigital electrode (for example, the central part and the spacing part) at a side away from the base substrate in a third direction perpendicular to the main surface of the base substrate, or may also be protruded from a surface of the bus bar at a side away from the base substrate. For example, the end portion of the interdigital electrode has a first thickness, and the central part and the spacing part have a second thickness, wherein the first thickness is greater than the second thickness, and a difference between the first thickness and the second thickness is a thickness of the end protrusion. All of the above thicknesses are in the third direction perpendicular to the main surface of the base substrate. The end protrusions of a plurality of interdigital electrodes collectively constitute the protruding structure to serve as a clutter suppression structure to suppress or reduce the clutter that may exist in the resonator device. For example, the body structure of the interdigital electrode structure is constituted by other parts except the protruding structure, including, for example, the central parts, the spacing parts and the end bodies of the end portions of a plurality of interdigital electrodes. For example, the body structure may further include a first bus bar and a second bus bar. A thickness of the first bus bar and the second bus bar may be as same as that of the central parts and the spacing parts of the plurality of interdigital electrodes, that is, may be the second thickness.

In each interdigital electrode, the end body and the end protrusion are directly connected with each other and are integrally formed, so there is no interface between the end body and the end protrusion. The end protrusion is aligned (e.g., completely aligned) with the end body in a direction perpendicular to the main surface of the base substrate (e.g., the third direction D3). In some embodiments, the end protrusions in the first interdigital electrode end region ER1 may be collectively referred to as first protrusions 5, and the end protrusions in the second interdigital electrode end region ER2 may be collectively referred to as second protrusions 6. That is, the protruding structure includes the first protrusions 5 disposed in the first interdigital electrode end region ER1 and the second protrusions 6 disposed in the second interdigital electrode end region ER2. That is, in the first interdigital electrode end region ER1, a plurality of first protrusions 5 may be disposed in one-to-one correspondence with the end parts of a plurality of interdigital electrodes; each first protrusion 5 is disposed corresponding to the first end of the first interdigital electrode 1 or the second end of the second interdigital electrode 2. In the second interdigital electrode end region ER2, a plurality of second protrusions 6 may be disposed in one-to-one correspondence with the end parts of a plurality of interdigital electrodes; each second protrusion 6 is disposed corresponding to the second end of the first interdigital electrode 1 or the first end of the second interdigital electrode 2.

In the present disclosure, the first protrusion or the second protrusion being disposed corresponding to the end of the corresponding interdigital electrode refers to that, the end of the interdigital electrode includes an end body and the protrusion (i.e., the end protrusion), and the end body and the end protrusion are overlapped (e.g., completely overlapped) in a direction perpendicular to the main surface of the base substrate (e.g., the third direction D3); an orthographic projection of the end protrusion on the base substrate is completely coincident with an orthographic projection of the corresponding end body on the base substrate; an edge (e.g., a sidewall) of the end protrusion and an edge (e.g., a sidewall) of the corresponding end body are aligned (e.g., completely aligned) in a third direction D3 perpendicular to the main surface of the base substrate; here, the edge or sidewall of the end protrusion and the edge or sidewall of the end body refer to their sidewall extending in the second direction D2 or sidewall extending in the first direction D1; that is, each edge or sidewall of the end protrusion is aligned with the corresponding edge or sidewall of the end body in the third direction D3.

In some embodiments, the plurality of first protrusions 5 are aligned with each other in the second direction D2 and have substantially the same width in the first direction D1; the plurality of second protrusions 6 are aligned with each other in the second direction D2 and have substantially the same width in the first direction D1. The width of each first protrusion 5 in the first direction D1 and the width of each first protrusion 5 in the second direction D2 may be as same as the width of the end body of the corresponding interdigital electrode in the first direction D1 and the width of the end body of the corresponding interdigital electrode in the second direction D2, respectively.

Referring to FIG. 11, FIG. 24 and FIG. 25, in some embodiments, at least part of the interdigital electrode structure (for example, the body structure thereof) is embedded in the first temperature compensation layer 8, and is surrounded and wrapped by the first temperature compensation layer 8 in a direction parallel to the main surface of the base substrate. A surface of the interdigital electrode structure at a side away from the base substrate is covered by and in contact with the second temperature compensation layer 12.

In some embodiments, a surface of the body structure of the interdigital electrode structure at a side away from the base substrate, e.g., surfaces of, the parts of the plurality of interdigital electrodes located in the interdigital electrode central region CR, the first gap region GR1 and the second gap region GR2 (i.e., the central parts and the spacing parts of the first interdigital electrodes 1 and the second interdigital electrodes 2), and the first bus bar 3 and the second bus bar 4, at a side away from the base substrate are level with a surface of the first temperature compensation layer 8 at a side away from the base substrate, in a direction parallel to the main surface of the base substrate. In some embodiments, the body structure is embedded in the first temperature compensation layer 8, and the protruding structure is embedded in the second temperature compensation layer 12. For example, a sidewall of the body structure is in contact with the first temperature compensation layer 8; and a surface of the body structure at a side away from the base substrate, a sidewall of the protruding structure and a surface of the protruding structure at a side away from the base substrate are in contact with the second temperature compensation layer 12.

In some embodiments, the interdigital electrode structure includes a seed layer 9 and an electrode material layer 10. The seed layer 9 surrounds and covers at least part of sidewall of the electrode material layer 10 and a surface of the electrode material layer 10 at a side close to the base substrate, and is located between the electrode material layer 10 and the first temperature compensation layer 8, and between the electrode material layer 10 and the base substrate 7. At least a surface of the electrode material layer 10 at a side away from the base substrate is in contact with the second temperature compensation layer 12.

In some embodiments, a first metal layer 13 is disposed on the first bus bar 3, and a second metal layer 14 is disposed on the second bus bar 4. The manufacturing method for the surface acoustic wave resonator device of the present disclosure will be described below with reference to FIG. 11 and FIG. 12 to FIG. 26, in which FIG. 12 to FIG. 24 and FIG. 26 illustrate schematic cross-sectional views of structures of various steps in the manufacturing method corresponding to the cross-section line I-I' of FIG. 11, and FIG. 25 illustrates a schematic cross-sectional view of the surface acoustic wave resonator device formed by the manufacturing method and corresponding to the cross-section line II-II' of FIG. 11.

Figure 12:
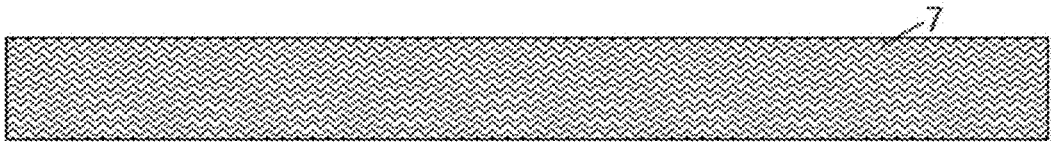
FIG. 12 is a schematic structural view of a base substrate provided by an embodiment of the present disclosure.
Figure 13:
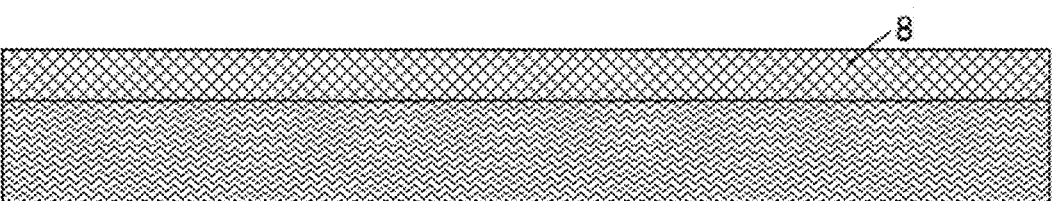
FIG. 13 is a schematic view illustrating a structure after depositing a first temperature compensation layer on a base substrate, as provided by an embodiment of the present disclosure.

Referring to FIG. 12 and FIG. 13, a base substrate 7 is provided, and a first temperature compensation layer 8 is formed on the base substrate 7. The base substrate 7 may be or include a piezoelectric substrate. For example, forming the first temperature compensation layer 8 includes depositing a temperature compensation material, and may further include performing a planarization process such as CMP on the temperature compensation material. For example, the first temperature compensation layer 8 may be a single layer of silicon oxide layer.

Figure 14:
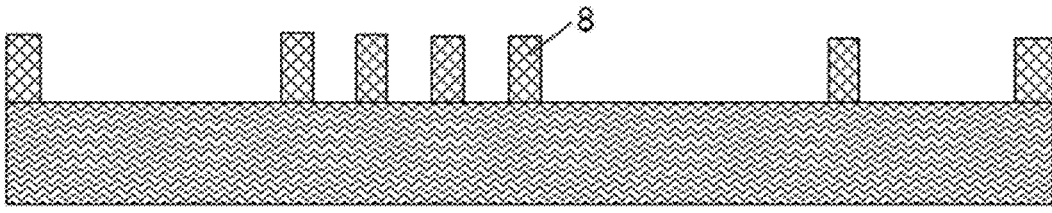
FIG. 14 is a schematic view illustrating a structure after etching a first temperature compensation layer to form a through hole, as provided by an embodiment of the present disclosure.
Figure 15:
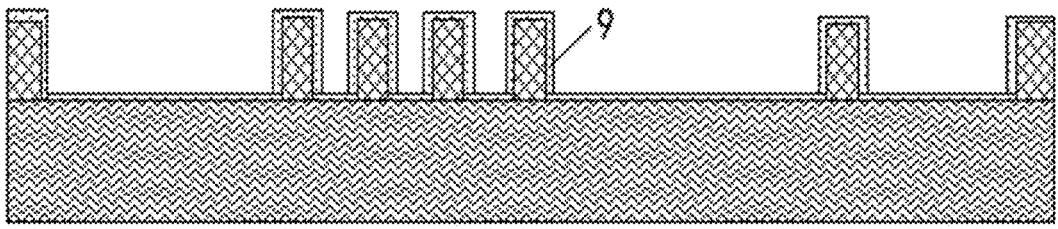
FIG. 15 is a schematic view illustrating a structure after depositing a seed layer on a base substrate being exposed and a first temperature compensation layer being etched, as provided by an embodiment of the present disclosure.

Referring to FIG. 13 and FIG. 14, a patterning process is performed on the first temperature compensation layer 8, and the patterning process includes the following processes: the first temperature compensation layer 8 is etched to form a through hole, which exposes a main surface of the base substrate 7 and has a pattern corresponding to the interdigital electrode structure formed subsequently. Thereafter, an interdigital electrode structure material layer is formed on the first temperature compensation layer 8 and in the through hole. For example, referring to FIG. 15, a seed layer 9 is deposited on the base substrate 7 having been exposed and the first temperature compensation layer 8 having been etched. The seed layer 9 covers a sidewall of the first temperature compensation layer 8 and a surface of the first temperature compensation layer 8 at a side away from the base substrate, and covers a surface of the base substrate exposed by the through hole of the first temperature compensation layer 8. That is, a portion of the seed layer 9 lines a surface of the through hole, and the portion of the seed layer 9 located in the through hole defines a recess.

Figure 16:
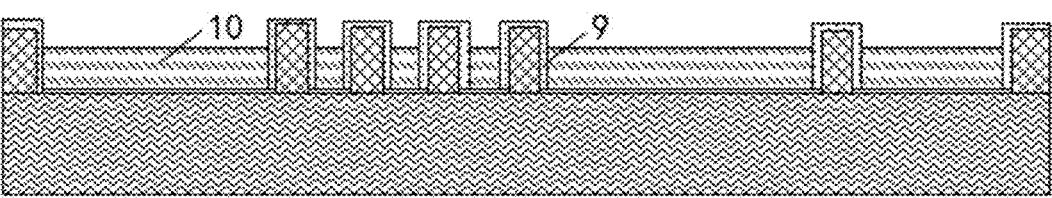
FIG. 16 is a schematic view illustrating a structure after filling an electrode metal in a recess, as provided by an embodiment of the present disclosure.

Referring to FIG. 16, an electrode material layer 10 is formed in the recess, and the electrode material layer 10 may partially or completely fill the recess. For example, in some embodiments, the electrode material layer 10 partially fills the recess; for example, a distance between a top surface of the electrode material layer 10 and the main surface of the base substrate is smaller than a distance between a topmost surface of the seed layer 9 and the main surface of the base substrate, or may also be smaller than a distance between a top surface of the first temperature compensation layer 8 and the main surface of the base substrate. The top surface or the topmost surface of each material layer described above refers to their surface at the side away from the base substrate. In this step, a thickness of the electrode material layer 10 may be greater than a sum of the thicknesses of the body structure and the protruding structure of the finally formed interdigital electrode structure. The seed layer 9 and the electrode material layer 10 collectively constitute the interdigital electrode structure material layer.

Figure 17:
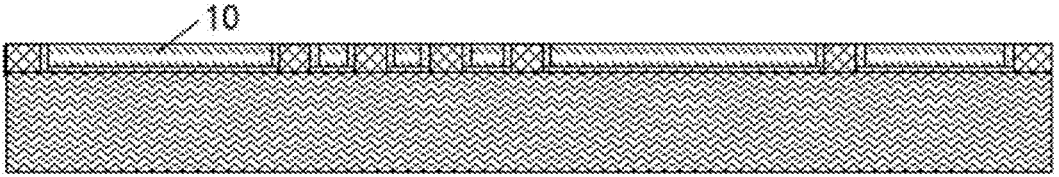
FIG. 17 is a schematic view illustrating a structure after an electrode metal, a first temperature compensation layer and a seed layer are at a target height, as provided by an embodiment of the present disclosure.

Next, a planarization process is performed on the interdigital electrode structure material layer and the first temperature compensation layer 8 to form the interdigital electrode structure. For example, referring to FIG. 16 and FIG. 17, a planarization process is performed on the electrode material layer 10, the first temperature compensation layer 8 and the seed layer 9, so that the electrode material layer 10, the first temperature compensation layer 8 and the seed layer 9 have a target height. The planarization process may at least include performing a planarization pretreatment on these material layers through a chemical mechanical polishing process or the like, and in some embodiments, the planarization process may further include performing a trimming process on these material layers after the planarization pretreatment so as to accurately control the thicknesses of these material layers. For example, the trimming process may include an ion beam etching process. For example, the planarization pretreatment is performed so that the electrode material layer 10, the first temperature compensation layer 8 and the seed layer 9 are all at a preset height, and the preset height is greater than the target height. Then, the electrode material layer 10, the first temperature compensation layer 8 and the seed layer 9 that have been planarized are etched by using the ion beam etching process, so that the electrode material layer 10, the first temperature compensation layer 8 and the seed layer 9 are at the target height, and the structure shown in FIG. 17 is formed. The target height is substantially equal to the thickness of the end portion of the finally formed interdigital electrode, that is, the sum of the thicknesses of the body structure and the protruding structure of the interdigital electrode structure.

As shown in FIG. 17, in some embodiments, after the planarization process, the remaining parts of the seed layer 9 and the electrode material layer 10 form the interdigital electrode structure, which includes first interdigital electrodes, second interdigital electrodes, a first bus bar and a second bus bar. After the planarization process, a surface (i.e., top surface) of the electrode material layer 10 at a side away from the base substrate, a surface (i.e., top surface) of the first temperature compensation layer 8 at a side away from the base substrate and a surface (i.e., the topmost surface) of the seed layer 9 at a side away from the base substrate may be substantially level with each other in a direction parallel to the main surface of the base substrate. In this step, various parts of the interdigital electrode structure have the same first thickness, the first thickness is a thickness or height in a direction perpendicular to the main surface of the base substrate.

Figure 18:
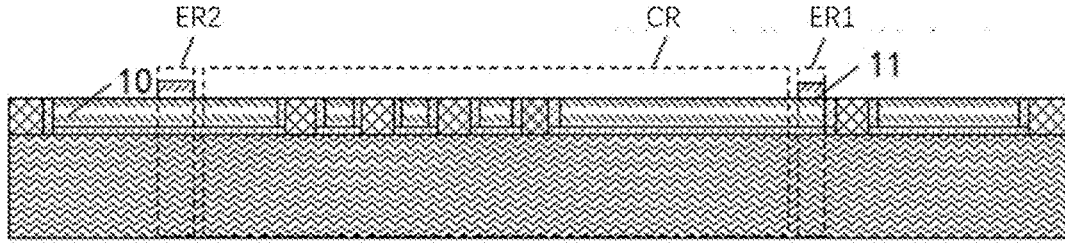
FIG. 18 is a schematic view illustrating a structure after a mask layer is deposited on a first interdigital electrode end region and a second interdigital electrode end region of an interdigital electrode structure, as provided by an embodiment of the present disclosure.

Referring to FIG. 18, a mask layer 11 is formed on the first interdigital electrode end region and the second interdigital electrode end region of the interdigital electrode structure; for example, the mask layer 11 may include photoresist and may be formed by a process such as deposition or coating. In some embodiments, the mask layer 11 includes a first mask pattern and a second mask pattern, and when viewed from a plan view or a top view, the first mask pattern and the second mask pattern may extend substantially parallel to each other in a second direction, and each cover the end parts of the corresponding interdigital electrodes. For example, the first mask pattern continuously extends in the first interdigital electrode end region, and covers the first ends of a plurality of first interdigital electrodes and the second ends of a plurality of second interdigital electrodes; the second mask pattern continuously extends in the second interdigital electrode end region, and covers the first ends of the plurality of second interdigital electrodes and the second ends of the plurality of first interdigital electrodes. In some embodiments, a sidewall of the first mask pattern close to the second bus bar is substantially aligned with a sidewall of the first interdigital electrode facing the second bus bar (for example, the corresponding sidewall of its seed layer or electrode material layer) in a direction perpendicular to the main surface of the base substrate; a sidewall of the second mask pattern close to the first bus bar is substantially aligned with a sidewall of the second interdigital electrode facing the first bus bar (for example, the corresponding sidewall of its seed layer or electrode material layer) in the direction perpendicular to the main surface of the base substrate.

Figure 19:
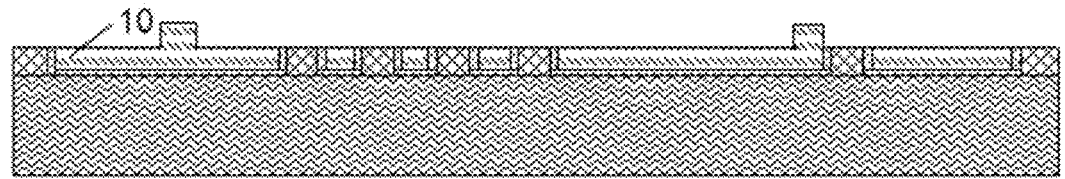
FIG. 19 is a schematic view illustrating a structure after etching an interdigital electrode structure and a first temperature compensation layer which are not covered by a mask layer and lifting off the mask layer, as provided by an embodiment of the present disclosure.

Referring to FIG. 18 and FIG. 19, an etching process is performed on the interdigital electrode structure and the first temperature compensation layer 8 by using the mask layer 11 as an etching mask, thereby etching and removing portions of the interdigital electrode structure and the first temperature compensation layer 8 that are not covered by the mask layer 11, so that thicknesses of the portions of the interdigital electrode structure and the first temperature compensation layer 8 that are not covered by the mask layer 11 are thinned, for example, thinned from the first thickness to the second thickness. Thereafter, the mask layer 11 is removed to form a structure as shown in FIG. 19. In an example where the mask layer 11 includes a photoresist, removing the mask layer 11 includes lifting off the photoresist.

In the etching process, the end parts of the plurality of interdigital electrodes in the interdigital electrode end region are covered by the mask layer 11, and thus are not be thinned but still have the first thickness after the etching process; and the thicknesses of other parts of the plurality of interdigital electrodes (i.e., the central parts and the spacing parts) and the thicknesses of the first and second bus bars are reduced from the first thickness to the second thickness. In this way, a protruding structure is formed in the interdigital electrode end region (i.e., the end protrusions at the end parts of the plurality of interdigital electrodes that are protruded relative to other parts). In other words, the interdigital electrode structure is etched to form a body structure with a second thickness and a protruding structure which is protruded from the body structure.

Figure 20:
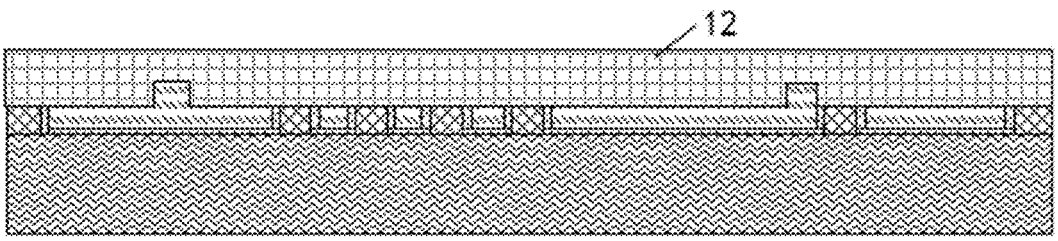
FIG. 20 is a schematic view illustrating a structure after depositing a second temperature compensation layer on a first temperature compensation layer and an interdigital electrode structure having been etched, as provided by an embodiment of the present disclosure.

Referring to FIG. 20, a second temperature compensation layer 12 is formed on the first temperature compensation layer 8 and the interdigital electrode structure to cover the interdigital electrode structure and the first temperature compensation layer 8. For example, forming the second temperature compensation layer 12 may include depositing a temperature compensation material, and may further include performing a planarization process such as CMP on the temperature compensation material, so that the second temperature compensation layer 12 has a flat surface.

Figure 21:
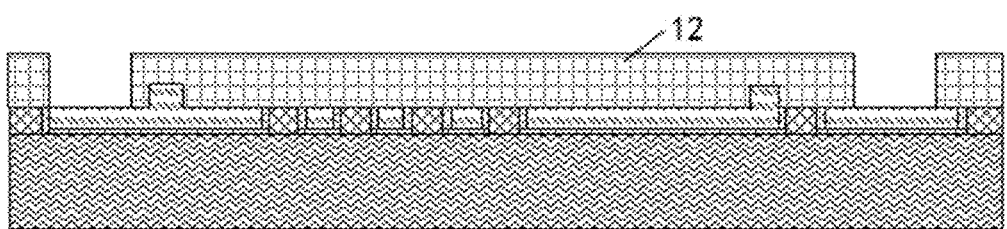
FIG. 21 is a schematic view illustrating a structure after etching a second temperature compensation layer as provided by an embodiment of the present disclosure.

Referring to FIG. 21, the second temperature compensation layer 12 is etched to form a first opening and a second opening in the second temperature compensation layer 12, which expose the first bus bar of the interdigital electrode structure and the second bus bar of the interdigital electrode structure, respectively.

Figure 22:
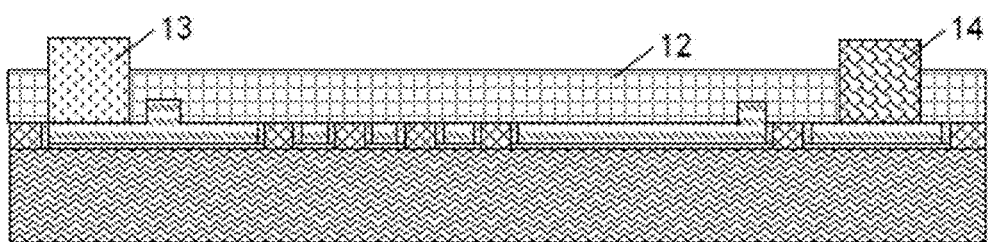
FIG. 22 is a schematic view illustrating a structure after forming a first metal layer on a first bus bar and forming a second metal layer on a second bus bar, as provided by an embodiment of the present disclosure.

Referring to FIG. 22, a first metal layer 13 is formed on the first bus bar exposed by the first opening, and a second metal layer 14 is formed on the second bus bar exposed by the second opening.

Figure 23:
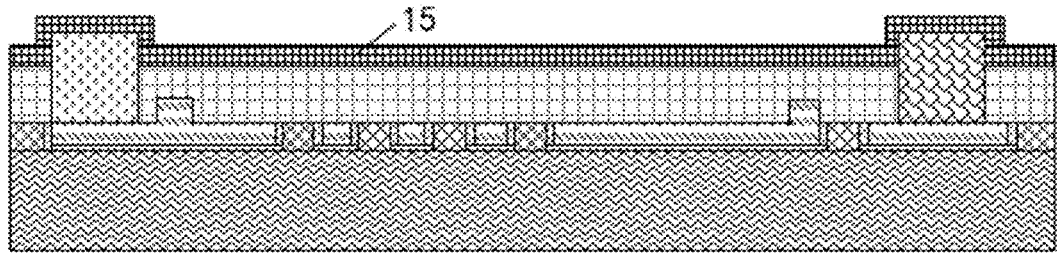
FIG. 23 is a schematic view illustrating a structure after depositing a passivation layer on a first metal layer, a second metal layer and a second temperature compensation layer, as provided by an embodiment of the present disclosure.

Referring to FIG. 23 and FIG. 24, a passivation layer 15 is deposited on the first metal layer 13, the second metal layer 14 and the second temperature compensation layer 12. Thereafter, the passivation layer 15 is etched to expose the first metal layer 13 and the second metal layer 14, and the structure as shown in FIG. 24 is formed. In this case, the surface acoustic wave resonator device in a cross-sectional view taken along line II-II' as shown in FIG. 11 is illustrated to have the structure shown in FIG. 25. As shown in FIG. 24 and FIG. 25, a first temperature compensation layer is disposed on the base substrate, and the first temperature compensation layer is provided with a through hole to expose the base substrate. A portion of the seed layer located in the through hole defines a recess, and the recess is filled with an electrode material layer. The seed layer and the electrode material layer in the through hole collectively constitute an interdigital electrode structure, and an interdigital electrode end region of the interdigital electrode structure is formed with a protruding structure (for example, a metal protrusion). A second temperature compensation layer is formed on the first temperature compensation layer, the seed layer and the electrode metal; and the second temperature compensation layer is provided with openings which expose a first bus bar and a second bus bar of the interdigital electrode structure. A first metal layer is disposed on the first bus bar, and a second metal layer is disposed on the second bus bar. A passivation layer 15 is disposed on the second temperature compensation layer, the first metal layer and the second metal layer; and the passivation layer is provided with through holes to expose the first metal layer and the second metal layer.

Referring to FIG. 11, FIG. 24 and FIG. 25, in the surface acoustic wave resonator device of the present disclosure, the interdigital electrode structure is located on the base substrate, and is located in the through hole of the first temperature compensation layer 8. The interdigital electrode structure may include an electrode material layer 10 and a seed layer 9. The first temperature compensation layer 8 is located laterally aside the interdigital electrode structure in a direction (e.g., a horizontal direction, including the first direction D1 and the second direction D2) parallel to the main surface of the base substrate 7, and surrounds and wraps the interdigital electrode structure. The seed layer 9 covers a sidewall of the first temperature compensation layer 8 and covers a surface of the base substrate 7 that is not covered by the first temperature compensation layer 8. At least a portion of the electrode material layer 10 is surrounded by the seed layer 9; for example, the seed layer 9 surrounds and covers sidewalls of the electrode material layer 10 and a surface of the electrode material layer 10 at a side close to the base substrate, and separates the electrode material layer 10 from the first temperature compensation layer 8, and separates the electrode material layer 10 from the base substrate 7. The seed layer 9 can be used as an adhesion layer of the interdigital electrode structure to improve the adhesion between the interdigital electrode structure and the first temperature compensation layer 8, thereby avoiding a gap being occurred between the interdigital electrode structure and the first temperature compensation layer 8, so that the first temperature compensation layer 8 can more tightly wrap the interdigital electrode structure, thereby improving the TCF performance of the surface acoustic wave resonator device and the filter.

In some embodiments, a surface of the first temperature compensation layer 8 at a side away from the base substrate and a surface of the body structure of the interdigital electrode structure at a side away from the base substrate are substantially level with each other in a direction parallel to the main surface of the base substrate. The protruding structure of the interdigital electrode structure is protruded from surfaces of the body structure of the interdigital electrode structure and the first temperature compensation layer at a side away from the base substrate in a direction perpendicular to the main surface of the base substrate. In some embodiments, the body structure of the interdigital electrode structure includes the seed layer 9 and a portion of the electrode material layer 10 surrounded by the seed layer 9, while the protruding structure includes a protruding portion of the electrode material layer 10 but does not include the seed layer. However, the present disclosure is not limited thereto. In some other embodiments, the protruding structure may also include the seed layer 9; for example, a portion of the seed layer 9 may be located between an outer sidewall of the protruding portion of the electrode material layer 10 and the second temperature compensation layer 12, while an inner sidewall of the protruding portion of the electrode material layer 10 and a surface of the protruding portion at a side away from the base substrate are in contact with the second temperature compensation layer 12.

Figure 26:
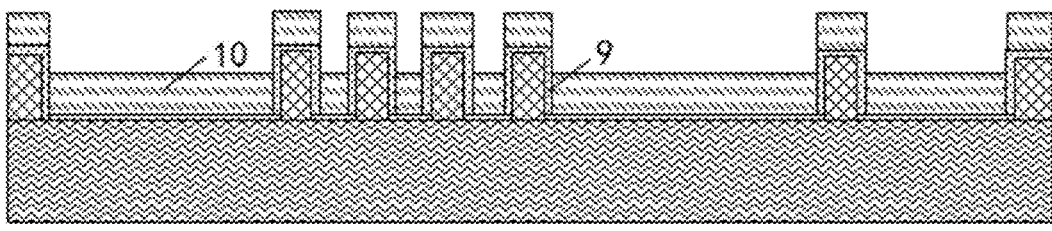
FIG. 26 is a schematic view illustrating a structure after filling an electrode metal in a recess through an evaporation process, as provided by an embodiment of the present disclosure.

The second temperature compensation layer 12 is disposed on a side of the first temperature compensation layer 8 away from the base substrate, and covers and is in contact with a surface of the body structure of the interdigital electrode structure at a side away from the base substrate, sidewalls of the protruding structure and a surface of the protruding structure at a side away from the base substrate, and a surface of the first temperature compensation layer at a side away from the base substrate. In the above embodiment, the electrode material of the interdigital electrode structure is formed by an electroplating process in the step shown in FIG. 16, but the present disclosure is not limited thereto. In some other embodiments, in this step, the electrode material may also be filled in the recess through an evaporation process, and the structure as shown in FIG. 26 will be formed after the electrode material is evaporated. As shown in FIG. 26, the electrode material 10 is not only formed in the recess, but also formed on a side of the first temperature compensation layer away from the base substrate and on a part of the seed layer 9 located outside the recess, the part of the seed layer 9 covers a surface of the first temperature compensation layer at a side away from the base substrate. If the electrode material is formed by using an evaporation process, the electrode material located at the side of the first temperature compensation layer away from the base substrate further needs to be removed in the planarization process shown in FIG. 17.

Some embodiments of the present disclosure provide a surface acoustic wave resonator device, which is manufactured by performing the above-described method for manufacturing a surface acoustic wave resonator device.

An embodiment of the present disclosure provides a surface acoustic wave filter, which includes the above-described surface acoustic wave resonator device.

Optionally, the surface acoustic wave resonator device includes a base substrate, a first temperature compensation layer and an interdigital electrode structure. The first temperature compensation layer is disposed on the base substrate and is in contact with the base substrate; the interdigital electrode structure is embedded in the first temperature compensation layer, and is in contact with the first temperature compensation layer and the base substrate; an interdigital electrode end region of the interdigital electrode structure is formed with a protruding structure (e.g., a metal protrusion); a plurality of protrusions in the metal protrusion are respectively aligned with first interdigital electrodes or second interdigital electrodes in a vertical direction.

In the surface acoustic wave resonator device and the filter provided by the embodiments of the present disclosure, the first temperature compensation layer is disposed on the base substrate to be in contact with the base substrate, and the interdigital electrode structure is disposed in the first temperature compensation layer to be in contact with the first temperature compensation layer and the base substrate, and the second temperature compensation layer is disposed on the first temperature compensation layer and the interdigital electrode structure, so that the temperature compensation layer can tightly wrap the interdigital electrode structure, thereby improving the TCF performance of the surface acoustic wave resonator device and the filter. Through the above-described manufacturing method, the metal protrusions are formed in the interdigital electrode end region of the interdigital electrode structure, so that the metal protrusions are self-aligned with, for example, completely aligned with the end bodies of the first interdigital electrodes or the second interdigital electrodes in the vertical direction, thus avoiding the problems shown in FIG. 3 to FIG. 5 and FIG. 7. In this way, the metal protrusion, serving as a clutter suppression structure, is aligned with the first interdigital electrode or the second interdigital electrode in the vertical direction, which can improve the clutter suppression effect of the surface acoustic wave resonator device and the filter.

In some embodiments, from an edge of the first interdigital electrode away from the first bus bar, toward a direction in which the first interdigital electrode is connected to the first bus bar, a preset length of the first interdigital electrode is taken as the first end of the first interdigital electrode. From an edge of the second interdigital electrode away from the second bus bar, toward a direction in which the second interdigital electrode is connected to the second bus bar, a preset length of the second interdigital electrode is taken as the second end of the second interdigital electrode.

The above description and the drawings fully illustrate the embodiments of the present disclosure so that those skilled in the art can practice the embodiments. Other embodiments may include structural, logical, electrical, process and other changes. The embodiments only represent possible variations. Individual components and functions are optional unless explicitly required, and the order of operations can be changed. Parts and features of some embodiments may be included in or substituted for parts and features of other embodiments. Moreover, the words used in the present disclosure are only used to describe the embodiments and are not used to limit the claims. As used in the description of the embodiments and the claims, the singular forms of "a/an" and "the" are intended to include the plural forms as well, unless the context clearly indicates. Similarly, the term "and/or" as used in the present disclosure is meant to include any and all possible combinations of one or more associated listings. In addition, when used in the present disclosure, the term "comprise" and its variants "comprises" and/or "comprising" refer to the existence of the stated feature, entirety, step, operation, element, and/or component, but do not exclude the existence or addition of one or more other features, entireties, steps, operations, elements, components and/or groups thereof. Without more restrictions, an element defined by the sentence "including one . . . " does not exclude that there are other identical elements in the process, method or equipment including this element. Herein, each embodiment can focus on the differences from other embodiments, and the same and similar parts between various embodiments can be referred to each other. For the methods and products disclosed in the embodiments, if they correspond to the method parts disclosed in the embodiments, reference can be made to the description of the method parts for the relevant portions.

The invention claimed is:

1. A surface acoustic wave resonator device, comprising:
a base substrate;
a first layer, disposed on the base substrate;
an interdigital electrode structure, disposed on the base substrate and at least partially embedded in the first layer, wherein the interdigital electrode structure comprises a plurality of interdigital electrodes extending along a first direction and arranged along a second direction, and the interdigital electrode structure has an interdigital electrode central region, and a first interdigital electrode end region and a second interdigital electrode end region which are located at two opposite sides of the interdigital electrode central region in the first direction; and
a second layer, located on a side of the first layer and the interdigital electrode structure away from the base substrate;
wherein the interdigital electrode structure is surrounded and wrapped by the first layer in a direction parallel to a main surface of the base substrate, and a surface of the interdigital electrode structure at a side away from the base substrate is covered by and in contact with the second layer,
wherein the first layer and the second layer are two layers with an interface between the first layer and the second layer, the interdigital electrode structure comprises a body structure embedded in the first layer and a protruding structure embedded in the second layer, and a surface of the body structure at a side away from the base substrate and a surface of the first layer away from the base structure are level with each other in the direction parallel to the main surface of the base substrate,
wherein the interdigital electrode structure comprises a seed layer and an electrode material layer, and in the body structure, the seed layer covers a sidewall of the electrode material layer and laterally sandwiched between the electrode material layer and the first layer, and
wherein in the protruding structure, a sidewall of the electrode material layer is not covered by the seed layer and is in contact with the second layer.

2. The surface acoustic wave resonator device according to claim 1, wherein surfaces, at a side away from the base substrate, of portions of the plurality of interdigital electrodes located in the interdigital electrode central region are level with a surface of the first layer at a side away from the base substrate in the direction parallel to the main surface of the base substrate.

3. The surface acoustic wave resonator device according to claim 1, wherein the seed layer also covers a surface of the electrode material layer at a side close to the base substrate, and is located between the electrode material layer and the base substrate.

4. The surface acoustic wave resonator device according to claim 3, wherein at least a surface of the electrode material layer at a side away from the base substrate is in contact with the second layer.

5. The surface acoustic wave resonator device according to claim 1,
wherein the protruding structure is located in the first interdigital electrode end region and the second interdigital electrode end region, and the protruding structure is protruded from a surface of the body structure at a side away from the base substrate in a direction perpendicular to the main surface of the base substrate.

6. The surface acoustic wave resonator device according to claim 5, wherein the body structure and the protruding structure are integrally formed and have sidewalls aligned in the direction perpendicular to the main surface of the base substrate.

7. The surface acoustic wave resonator device according to claim 1, wherein the first layer is a first temperature compensation layer, and the second layer is a second temperature compensation layer.

8. The surface acoustic wave resonator device according to claim 1, wherein a sidewall of the body structure is in contact with the first layer; and the surface of the body structure at the side away from the base substrate, a sidewall of the protruding structure, and a surface of the protruding structure at a side away from the base substrate are in contact with the second layer.

9. A surface acoustic wave filter, comprising the surface acoustic wave resonator device according to claim 1.

10. A method for manufacturing a surface acoustic wave resonator device, comprising:
providing a base substrate;
forming a first layer on the base substrate;
performing a patterning process on the first layer to form a through hole exposing the base substrate; and
forming an interdigital electrode structure in the through hole of the first layer, such that the interdigital electrode structure is disposed on the base substrate and at least partially embedded in the first layer; wherein the interdigital electrode structure comprises a plurality of interdigital electrodes extending along a first direction and arranged along a second direction, and the interdigital electrode structure has an interdigital electrode central region, and a first interdigital electrode end region and a second interdigital electrode end region which are located at two opposite sides of the interdigital electrode central region in the first direction; and forming a second layer on a side of the first layer and the interdigital electrode structure away from the base substrate, wherein the interdigital electrode structure is surrounded and wrapped by the first layer in a direction parallel to a main surface of the base substrate, and a surface of the interdigital electrode structure at a side away from the base substrate is covered by and in contact with the second layer, wherein the first layer and the second layer are two layers with an interface between the first layer and the second layer, the interdigital electrode structure comprises a body structure embedded in the first layer and a protruding structure embedded in the second layer, and a surface of the body structure at a side away from the base substrate and a surface of the first layer away from the base structure are level with each other in the direction parallel to the main surface of the base substrate, wherein the interdigital electrode structure comprises a seed layer and an electrode material layer, and in the body structure, the seed layer covers a sidewall of the electrode material layer and laterally sandwiched between the electrode material layer and the first layer, and wherein in the protruding structure, a sidewall of the electrode material layer is not covered by the seed layer and is in contact with the second layer.

11. The method for manufacturing the surface acoustic wave resonator device according to claim 10, wherein forming the interdigital electrode structure in the through hole of the first layer comprises:

forming an interdigital electrode structure material layer in the through hole; and performing a planarization process on the interdigital electrode structure material layer and the first layer.

12. The method for manufacturing the surface acoustic wave resonator device according to claim 11, wherein forming the interdigital electrode structure material layer in the through hole comprises:

forming the seed layer, wherein the seed layer lines a surface of the through hole and covers a surface of the first layer at a side away from the base substrate, and a portion of the seed layer located in the through hole defines a recess; and forming the electrode material layer in the recess, wherein after the planarization process, remaining parts of the seed layer and the electrode material layer constitute the interdigital electrode structure.

13. The method for manufacturing the surface acoustic wave resonator device according to claim 10, wherein forming the interdigital electrode structure in the through hole comprises:

depositing the seed layer on the base substrate having been exposed and the first layer having been patterned, wherein a portion of the seed layer located in the through hole defines a recess;

filling an electrode metal in the recess; and performing a planarization process on the electrode metal, the first layer and the seed layer, such that surfaces of the first layer, the electrode metal and the seed layer are level with each other, wherein after the planarization process, the portion of the seed layer and the electrode metal located in the through hole constitute the interdigital electrode structure.

14. The method for manufacturing the surface acoustic wave resonator device according to claim 13, wherein performing the planarization process on the electrode metal, the first layer and the seed layer comprises:

planarizing the electrode metal, the first layer and the seed layer by using a chemical mechanical polishing process; and etching the electrode metal, the first layer and the seed layer which have been planarized by using an ion beam etching process, so that the electrode metal, the first layer and the seed layer are located at a preset target height.

15. The method for manufacturing the surface acoustic wave resonator device according to claim 10, wherein before forming the second layer, further comprising:

forming a mask layer on the first interdigital electrode end region and the second interdigital electrode end region of the interdigital electrode structure; and performing an etching process on the interdigital electrode structure by using the mask layer as an etching mask, so as to thin portions of the interdigital electrode structure located in other regions other than the first interdigital electrode end region and the second interdigital electrode end region, so that the first interdigital electrode end region and the second interdigital electrode end region of the interdigital electrode structure are formed with the protruding structure.

16. The method for manufacturing the surface acoustic wave resonator device according to claim 10, wherein the interdigital electrode structure further comprises a first bus bar and a second bus bar; and the method further comprises:

etching the second layer to form a first opening and a second opening in the second layer to expose the first bus bar and the second bus bar, respectively; and forming a first metal layer on the first bus bar exposed by the first opening, and forming a second metal layer on the second bus bar exposed by the second opening.

17. The method for manufacturing the surface acoustic wave resonator device according to claim 16, wherein after forming the first metal layer on the first bus bar and forming the second metal layer on the second bus bar, further comprising:

depositing a passivation layer on the first metal layer, the second metal layer and the second layer; and etching the passivation layer to expose the first metal layer and the second metal layer.

* * * * *